(12) United States Patent  (10) Patent No.: US 6,522,213 B2
Hashimoto  (45) Date of Patent: Feb. 18, 2003

(54) SSB TRANSMITTER

(75) Inventor: Yoshiteru Hashimoto, Tokyo (JP)

(73) Assignee: Vertex Standard Co., Ltd., Tokyo (JP)

( * ) Notice: Subject to any disclaimer, the term of this patent is extended or adjusted under 35 U.S.C. 154(b) by 0 days.

(21) Appl. No.: 09/971,877

(22) Filed: Oct. 4, 2001

(65) Prior Publication Data

US 2002/0044024 A1 Apr. 18, 2002

(30) Foreign Application Priority Data

Oct. 6, 2000 (JP) ........................................ 2000-308270

(51) Int. Cl.$^7$ ............................. H03C 1/60; H04B 1/68
(52) U.S. Cl. .................... 332/170; 332/159; 455/109
(58) Field of Search ................................ 332/149, 150, 332/159, 170; 455/108, 109, 115

(56) References Cited

U.S. PATENT DOCUMENTS 5,375,146 A * 12/1994 Chalmers ..................... 375/344
6,366,175 B2 * 4/2002 Oka ......................... 331/116 R

* cited by examiner

*Primary Examiner*—David C. Mis
(74) *Attorney, Agent, or Firm*—Fulwider Patton Lee & Utecht, LLP

(57) ABSTRACT

In an SSB transmitter, a problem such that the central frequency of a BPF for extracting one of sideband signals from the modulated signals obtained by modulating a carrier frequency signal by an input sound signal is changed by temperatures, causing a drop in suppression ration and a deterioration in sound is solved. The microcomputer circuit 23 determines the change of the central frequency ($-\Delta\alpha$) of the BPF 5 from the compensation table related to the BPF 5 stored in the ROM 32 based on a temperature information of the BPF 5 detected by the temperature sensor 21; controls local oscillators 4a and 7a that output modulated signals and VHF band signals to the balanced modulator 3 and the mixer 6; and changes the frequency of each signal by $-\Delta\alpha$ from the standard condition. By the accommodation control, in the BPF 5, the suppression of a carrier signal and the extraction of one sideband signal can always be executed under the same conditions as under the standard condition and the difference component signal by the mixer 6 becomes a radio frequency signal with a prescribed frequency, and this is extracted by the BPF 8.

2 Claims, 7 Drawing Sheets

Fig.7 (A)
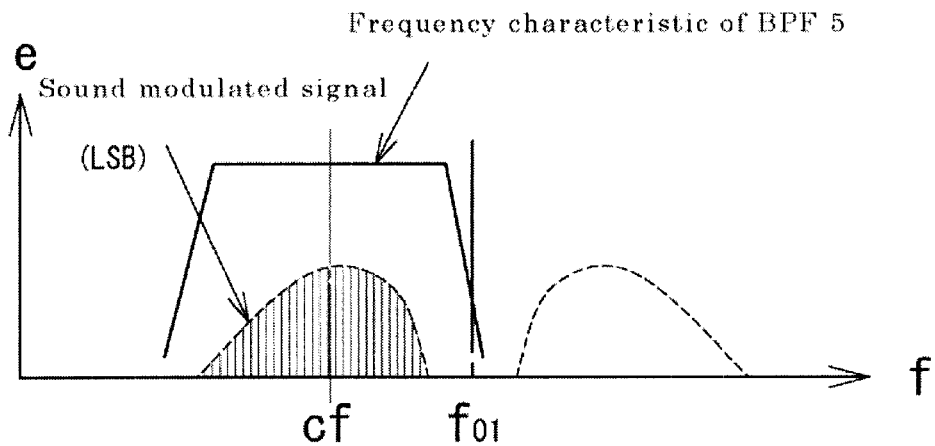
(B)
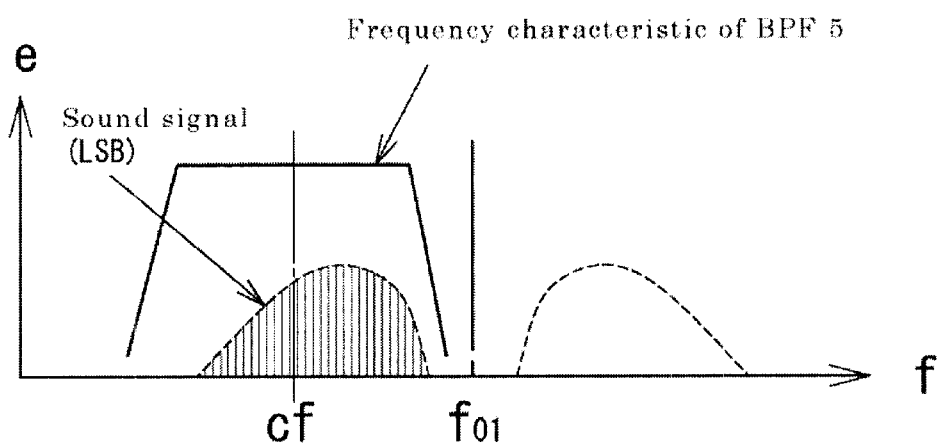
(C)
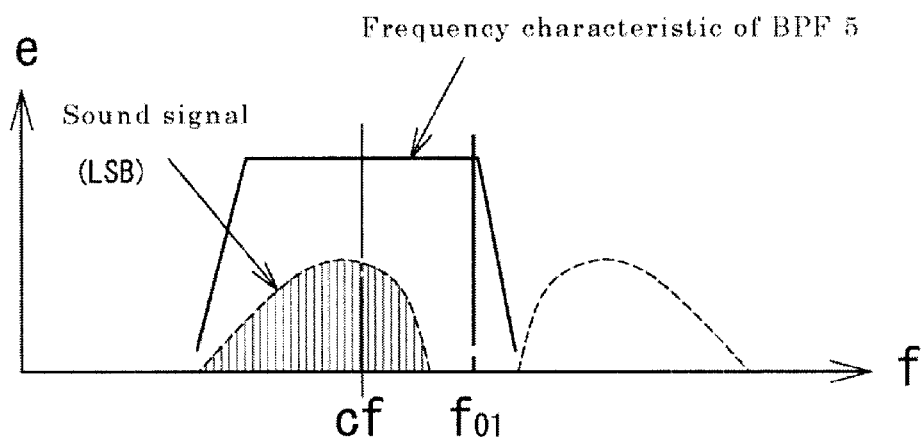

SSB TRANSMITTER

BACKGROUND OF THE INVENTION

1. Field of the Invention

This invention relates to an Single Side Band hereinafter referred to as a (SSB) transmitter, and in particular relates to improvements to prevent a decrease in suppression ratio of a carrier wave and a deterioration of a sound signal that occur due to a temperature characteristic of a band path filter (hereinafter referred to as a BPF) which extracts only one of the sideband signals after an amplitude modulation of a carrier frequency signal by an input signal.

2. Related Art

Since the SSB communication system is to perform its communication function using either one of the sideband signals and because of a benefit such that an occupied frequency is almost half of a DSB (Double Side Band) it allows an effective use of wave and a saving of electric power for transmission, it forms the main currents in AM wireless radio telephone communication system.

Conventionally, an SSB transmitter has a basic composition as shown in FIG. 6.

First, a sound input signal fs from a microphone 1 is amplified by an amplifier 2 and inputted to a balanced modulator 3, and the balanced modulator 3 amplitude-modulates a carrier frequency signal (frequency: $f_{o1}$), which is inputted from a local oscillator 4, by the sound input signal fs.

From the balanced modulator 3, two sideband signals (sound modulated signals) with frequency bands of ($f_{o1}$+fs) and ($f_{o1}$−fs) are obtained, and in this transmitter the lower sideband (LSB) signal ($f_{o1}$−fs) is extracted and outputted to a mixer 6 by a BPF 5.

At the mixer 6, two signals with frequency bands of [$f_{o2}$+($f_{o1}$−fs)] and [$f_{o2}$−($f_{o1}$−fs)] are obtained by mixing a signal (frequency: $f_{o2}$) of a VHF band of a local oscillator 7 and said LSB signal ($f_{o1}$−fs), and in this transmitter the LSB signal [$f_{o2}$−($f_{o1}$−fs)] that corresponds to a difference component is extracted by a BPF 8.

Said LSB signal [$f_{o2}$−($f_{o1}$−fs)] is inputted to a mixer 9, and at the mixer 9, to obtain a desired multi-channel emission frequency, a selective channel frequency signal ($f_L$~$f_H$) by a PLL synthesizer 10 and the LSB signal are mixed and a difference component ($f_L$~$f_H$)−[$f_{o2}$−($f_{o1}$−fs)] is extracted.

In this case, the phase of the difference component signal is inverted to make it an upper sideband (USB) signal.

And, the USB signal is amplified by an excitation amplifier/power amplifier 11, outputted to an antenna 12 and emission-transmitted from the antenna 12.

Incidentally, in this SSB transmitter, in which LSB signals are extracted at both the BPF 5 and BPF 8, which sideband signal to extract differs by the specification of SSB transmitter.

SUMMARY OF THE INVENTION

The BPF 5 is a filter to suppress carrier frequency signals and extract only one of the sideband signals, and as the provision of a sharp cut-off characteristic, a low insertion loss and an excellent temperature characteristic are required, generally a crystal filter is used.

Aiming at said temperature characteristic, the crystal filter has an excellent temperature characteristic, but the central frequency of a normal passband presents a change rate of some (Hz/° C.) by temperature changes.

Also, though sometimes a ceramic filter is used to save parts costs, but said change rate is considerable compared to the crystal filter.

And, the suppression ratio is set to 40 dB and larger in the SSB communication system, but in view of the effect of the temperature characteristic of said BPF 5 on its function, supposing the frequency $f_{o1}$ of the carrier frequency signal, the central frequency cf of BPF 5 and that FIG. 7(A) is a normal state of extraction, when the central frequency cf deviates towards the direction of FIG. 7(B), the suppression ratio increases, but since the passband shifts towards the low band side, a trend that the low band side of sound signal attenuates occurs, and when the central frequency cf of BPF 5 deviates towards FIG. 7(C) on the contrary, there is a possibility that the suppression ratio decreases below a specific value and a trend that the higher band side of sound signal attenuates occurs.

That is, there is a problem that, depending on the temperature characteristic of BPF 5, suppression of a carrier wave may become insufficient and the sound may be deteriorated.

To cope with this problem, conventionally efforts were made with measures to improve the temperature and cut-off characteristics of BPF 5 as much as possible, but naturally, since the room for improvements related to said characteristics of BPF was limited, it was not possible to take any sufficient measures.

Thus, in consideration of the above problem, this invention is made with an object of supplying an SSB transmitter that, even if the central frequency of the BPF, which is intended to extract only one sideband of modulated sound signals while suppressing carrier waves, changes by temperature, can always accommodation-compensate it and maintain a normal state of extraction.

A first embodiment relates to an SSB transmitter for amplitude-modulating a carrier frequency signal by first oscillation means by an input signal, extracting one of the sideband signals from the modulated signal by a first filter, mixing the sideband signal with a local oscillation frequency signal of second oscillation means, and extracting out of a sum component signal and a difference component signal obtained by said mixing the difference component signal by a second filter so as to obtain a radio frequency signal with a prescribed frequency, comprising: temperature detection means for detecting a temperature of said first filter; memory means for storing changes in central frequency of a passband due to temperature changes from a reference temperature at said first filter; and control means for changing the frequency of output signals of said first and second oscillation means by Δf when a change in central frequency of the passband of said first filter obtained by said memory means is Δf based on a temperature information detected by said temperature detection means, while setting a reference frequency of output signals of said first and second oscillation means for a frequency with which a radio frequency signal with said prescribed frequency can be obtained in the passband of said first filter at said reference temperature.

In this embodiment, the memory means previously stores the changes in central frequency due to temperature changes of the first filter, and based on the temperature information obtained from the temperature detection means that detects temperatures of the first filter, the control means detects the change Δf in said central frequency corresponding to a temperature change of the first filter, using the memory means.

And, the control means, by adapting the frequency of output signal of the first oscillation means for the passband of the first filter, where the central frequency is changed, by changing it by $\Delta f$, enables the first filter to normally perform suppression of carrier signals and extraction of sideband signals.

However, in this case a signal which is extracted by a second filter after being mixed with an output signal of the second oscillation means is also changed by $\Delta f$.

Thus, the control means is designed to also change the output signal of the second oscillation means by $\Delta f$ along with the control of said first oscillation means so as to obtain a normal radio frequency signal with a prescribed frequency.

Additionally, in this embodiment and in a second embodiment described below, the "radio frequency signal" means a signal extracted by the second filter, and in the case of mixing with a selected channel frequency signal by a PLL synthesizer and emission-transmission from an antenna, it corresponds to a signal before the mixing.

A second embodiment relates to an SSB transmitter for extracting a sum component signal, while the first embodiment aims at an SSB transmitter for extracting out of a sum component signal and a difference component signal after mixing the difference component signal by a second filter.

And, the temperature detection means, the memory means and control to the first oscillation means by the control means are the same as the first embodiment, while control related to the second oscillation means changes the frequency of output signal by said change to the opposite side. That is, this changes the output signal of the second oscillation means by $-\Delta f$.

In this embodiment, since the sum component signal side of the sum component signal and the difference component signal obtained by mixing the sideband signal extracted by the first filter with the output signal of the second oscillation means must not contain the change $\Delta f$, to cancel this, the output signal of the second oscillation means needs to be changed by $-\Delta f$.

Accordingly, the SSB transmitter of this embodiment too, like the first embodiment, can compensate changes in passband due to temperature changes of the first filter and always obtain a normal radio frequency signal with a prescribed frequency.

BRIEF DESCRIPTION OF THE DRAWINGS

FIG. 7 is a graph showing the conditions of suppression of a carrier frequency signal and extraction of a sound modulated signal (LSB) when the central frequency of BPF changes by temperature changes. However, (A) is a standard condition, but (B) and (C) are cases where the central frequency of BPF changes towards the lower band side and the higher band side, respectively.

DETAILED DESCRIPTION OF THE PREFERRED EMBODIMENTS

Henceforth preferred embodiments of the SSB transmitter of this invention are described in detail using FIG. 1 through FIG. 5.

1. Embodiment 1

Figure 1:
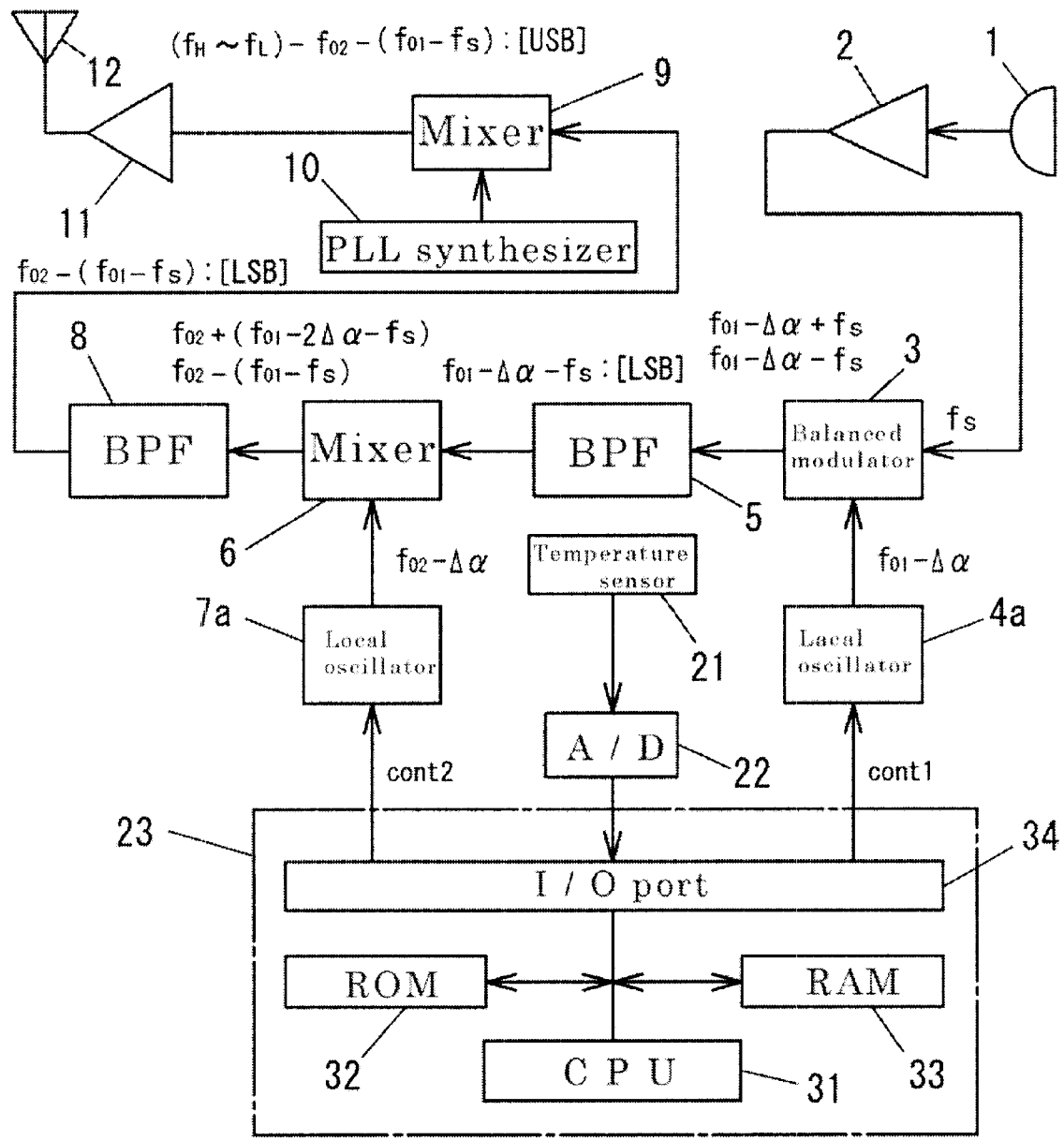
FIG. 1 is a system circuit diagram of an SSB transmitter by embodiment 1.

A system circuit diagram of the SSB transmitter of this embodiment is shown in FIG. 1.

Figure 6:
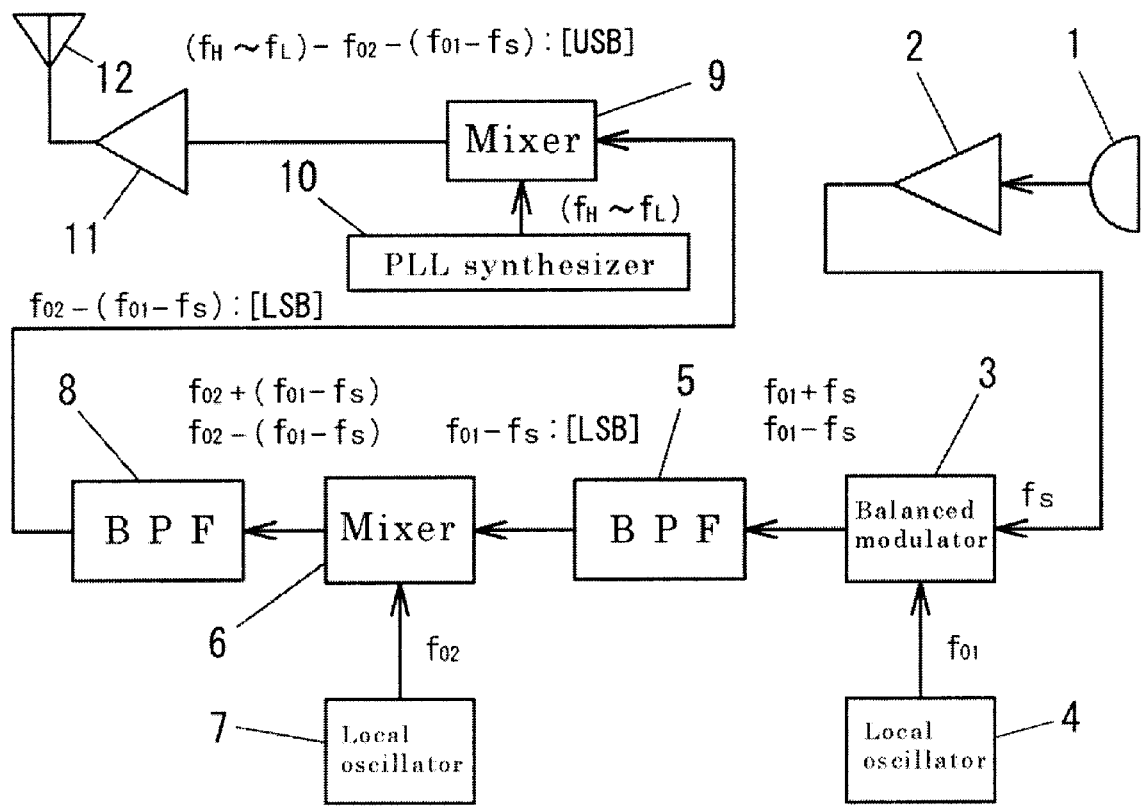
FIG. 6 is a system circuit diagram of an SSB transmitter by the prior art.

As it is clear by comparing FIG. 1 and FIG. 6, the basic composition as a transmitter is the same, and the circuit elements bearing the same symbols in these FIGS. correspond to each other.

The circuit composition of this embodiment features that a temperature sensor 21 for measuring the temperature of the BPF 5 is provided and an output of the temperature sensor 21 is taken to a microcomputer circuit 23 by way of an A/D converter 22, and that a local oscillator 4a for outputting a carrier frequency signal to a balanced modulator 3 and a local oscillator 7a for outputting a signal with a frequency of the VHF band to a mixer 6 can each vary the frequency, and that the microcomputer circuit 23 controls these frequencies by controlling the local oscillators 4a and 7a.

And, the microcomputer circuit 23 has a general composition comprising a CPU 31, a ROM 32, a RAM 33 and an I/O port 34, and a program for controlling local oscillators 4a and 7a and a compensation table related to the temperature characteristic of the BPF 5 are stored in the ROM 32.

Figure 2:
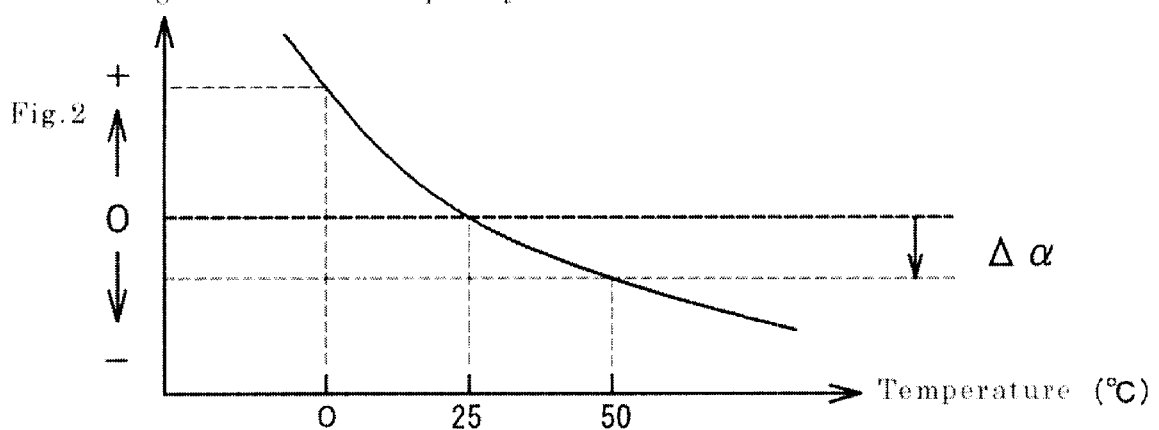
FIG. 2 is a graph showing changes in central frequency of a BPF due to temperatures to explain contents of a ROM compensation table.

Here, in the compensation table of the ROM 32, as shown in FIG. 2, a reference temperature of 25° C. is set, and the change data of central frequency cf of the BPF 5 correspond to temperature changes from the reference temperature. These can be prepared based on the data obtained by measuring the temperature characteristic of the BPF 5 actually used, but these may also be prepared by using the temperature characteristic data given in the specification of the BPF 5.

Also, the control program is to perform a procedure as to determine a temperature change from the reference temperature based on the temperature data of the temperature sensor 21 taken from the A/D converter 22, determine a change in central frequency cf by referring to said compensation table, and control the frequency of output signals of local oscillators 4a and 7a corresponding to the change.

Incidentally, of the recent SSB transmitters, many models have realized the shift and wise functions of radio frequency signals by controlling local oscillators by a microcomputer circuit, and the microcomputer circuit 23 of this embodiment may also be one that performs said control by combining these functions.

Figure 3:
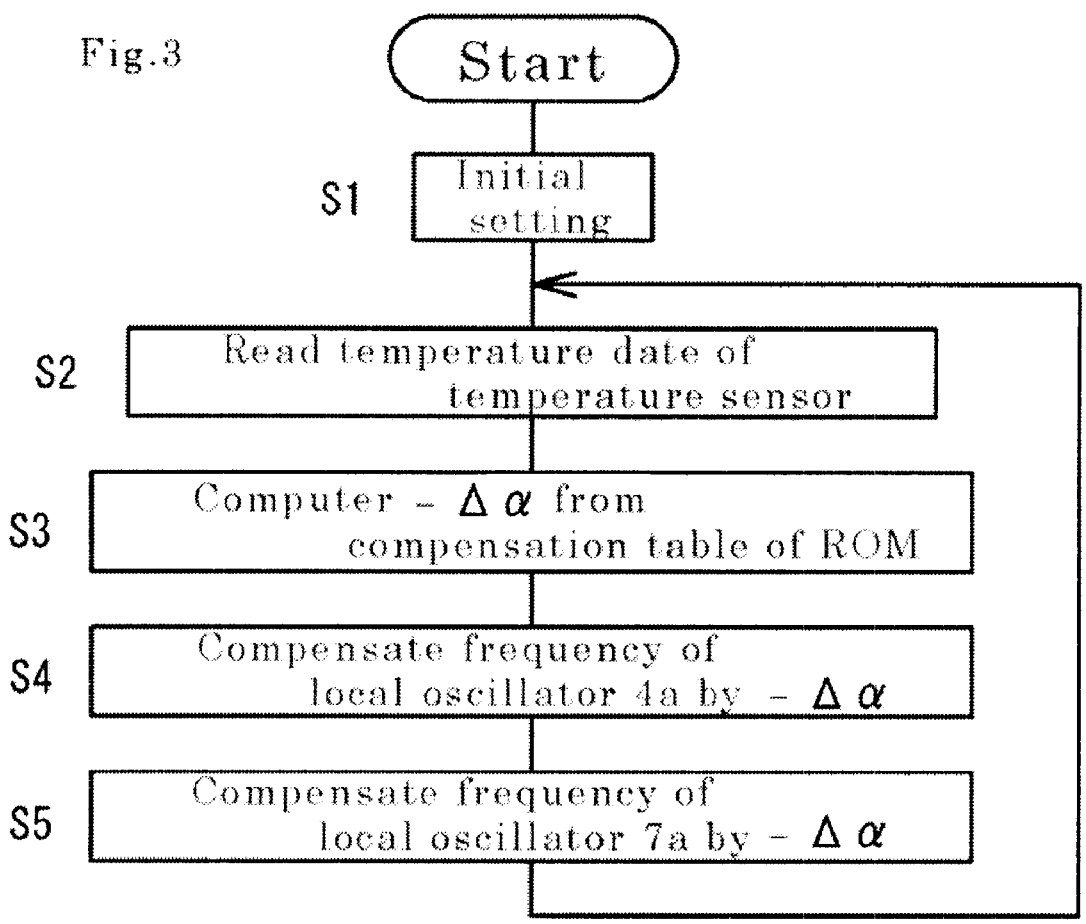
FIG. 3 is a flowchart showing the sequence of control operations to cope with temperature changes of the BPF.

Next, the control operation procedure to temperature changes of BPF 5 of the SSB transmitter of this embodiment is described using the flowchart of FIG. 3.

First, under the initial condition with the system power ON, supposing that the temperature of the BPF 5 is 25° C. to be a standard, the microcomputer circuit 23 sets the frequency of output signals of local oscillators 4a and 7a (S1).

That is, supposing a case in which the temperature of the BPF 5 is 25° C. to be a standard, which corresponds to the control condition of local oscillators 4a and 7a of which the normal frequency $[f_{o2}+(f_{o1}-fs)]$ is the radio frequency signal corresponding to the output of the BPF 8, the output signal of the local oscillator 4a is initially controlled to the reference carrier frequency signal $f_{o1}$ and the output signal of the local oscillator 7a is initially controlled to the reference frequency signal $f_{o2}$ of VHF band.

After said initial setting, the microcomputer circuit 23 takes the detected temperature data of the temperature sensor 21 of that time from the A/D converter 22 via the I/O port 34 to the RAM 33, determines the difference by comparing the reference temperature and the reference temperature of 25° C., and based on the result, determines the change of the central frequency cf of passband of the BPF 5 by referencing the compensation table of the ROM 32 (S2, S3).

In this case, when temperature values are coarse in the compensation table, the change of the central frequency cf may be determined by interpolation using various approximation formulas.

And, the microcomputer circuit 23 outputs control signals cont1 and cont2, which compensate the frequency of output signals of local oscillators 4a and 7a, respectively, by the change from each reference frequency $f_{01}$ and $f_{02}$, to local oscillators 4a and 7a and changes the frequency of these output signals (S4, S5).

For example, when the temperature of the BPF 5 is 50° C., it changes the central frequency cf of the BPF 5 by $\Delta\alpha$ to the lower band side as shown in FIG. 2, local oscillators 4a and 7a are controlled so as the frequency of output signals of these local oscillators 4a and 7a are ($f_{01}-\Delta\alpha$) and ($f_{02}-\Delta\alpha$).

Here, signal conditions of the balanced modulator 3, the BPF 5, the mixer 6 and the BPF 8 are verified at their circuit sections: first, as the temperature of the BPF 5 is increased from the reference temperature of 25° C. to 50° C. as described above, the central frequency cf is lowered by $\Delta\alpha$.

Accordingly, supposing that the local oscillator 4a remains with the standard carrier frequency signal $f_{01}$, the condition is as shown in FIG. 7(B), where a trend that the suppression ratio of carrier signal increases while the lower band side of the sound signal fs attenuates occurs.

Whereas, at the local oscillator 4a, since the output signal is ($f_{01}-\Delta\alpha$) by the control from the microcomputer circuit 23, the condition is such that $f_{01}$ of FIG. 7(B) shifted to the lower band side by $\Delta\alpha$, and accordingly the sideband signals related to the sound modulated signals which the mixer 6 outputs become ($f_{01}-\Delta\alpha+fs$) and ($f_{01}-\Delta\alpha-fs$) and appear in the same shifted condition.

As a result, under a condition at 50° C. of temperature, the correlation at the frequency axis of the output signal of the local oscillator 4a with regard to the passband of the BPF 5 and the sound modulation signal which the mixer 6 outputs is the same as in FIG. 7(A), namely the LSB signal ($f_{01}-\Delta\alpha-fs$) out of sound modulated signals is extracted in the normal passband at the BPF 5, and the output signal of the oscillator 4a that corresponds to the carrier frequency signal is also suppressed normally.

Meantime, the LSB signal extracted by the BPF 5 is ($f_{01}-\Delta\alpha-fs$), and if the output signal of the local oscillator 7a to the mixer 6 is left as the reference signal $f_{02}$ as in FIG. 6, output signals of the mixer 6 are [$f_{02}+(f_{01}-\Delta\alpha-fs)$] and [$f_{02}-(f_{01}-\Delta\alpha-fs)$], and so the originally required radio frequency signal [$f_{02}-(f_{01}-fs)$] cannot be obtained even by extracting the difference component signal [$f_{02}-(f_{01}-\Delta\alpha-fs)$] by the BPF 8.

Thus, the microcomputer circuit 23 is designed to also make the frequency of output signal of the local oscillator 7a ($f_{02}-\Delta\alpha$) by varying it by $-\Delta\alpha$ from the reference frequency $f_{02}$, so as output signals of the mixer 6 are [$f_{02}+(f_{01}+2\Delta\alpha-fs)$] and [$f_{02}-(f_{01}-fs)$], and so that a radio frequency signal with a prescribed frequency can be obtained by extracting the difference component signal [$f_{02}-(f_{01}-fs)$] by the BPF 8.

Further, this is described more concretely using numerical values: when the reference signal (carrier frequency signal) of the local oscillator 4a is $f_{01}$=10.7015 MHz, the reference signal of VHF band of the local oscillator 7a is $f_{02}$=60.7015 MHz and the SSB transmitter obtains a radio frequency signal of 50.000 MHz under a standard condition (where the temperature of the BPF 5 is 25° C.), supposing that the central frequency cf of the passband changes by $-\Delta\alpha$=100 Hz because of the BPF 5 that changed from the reference temperature of 25° C. to 50° C., the output signal of the local oscillator 4a is compensated as $f_{01}\Delta\alpha$=10.7014 MHz and the output signal of the local oscillator 7a is compensated as $f_{02}-\Delta\alpha$=60.7014 MHz, making the LSB signal extracted by the BPF 5 is ($f_{01}-\Delta\alpha-fs$)=(10.7014-fs)MHz, but since the resultant radio frequency signal [$f_{02}-(f_{01}-fs)$] is 50,000 MHz as prescribed, even when the central frequency cf of the BPF 5 changes due to temperature changes, both the extraction of an LSB signal and the suppression of a carrier signal can be performed and a normal radio frequency signal as under the standard condition can be obtained under the normal condition.

Reverting to the flowchart of FIG. 3, the microcomputer circuit 23 executes repeatedly the procedure of steps S2 through S5 and accommodation-changes the frequency of output signals of local oscillators 4a and 7a (S2~S5→S2).

Therefore, with regard to the frequency axis direction, the correlation of the passband of the BPF 5, the output signal of the local oscillator 4a and the sound modulated signal of the mixer 6 is always maintained optimally, the carrier wave is suppressed with a prescribed suppression ratio, and it is possible to obtain a radio frequency signal containing a sound modulated signal free of deterioration.

In the above example, a case that the temperature of the BPF 5 rises is described, however, when the temperature lowers, only the sign (plus or minus) of $\Delta\alpha$ becomes opposite and naturally control is done by the same principle.

In this embodiment, a case that the BPF 5 extracts an LSB signal is described, however, the above control conditions are the same for a case extracting a USB signal, too. Because, both sideband signals as output signals of the balanced modulator 3 only differ by whether the sound signal fs is a sum component or a difference component with regard to the output signal ($f_{01}-\Delta\alpha$) of the local oscillator 4a, and it does not affect control conditions.

Also, as the method of temperature detection of the BPF 5, direct temperature detection It either by bonding or pasting the temperature sensor 21 to the BPF 5 is preferred, however, a method for arranging the temperature sensor 21 near the BPF 5 within the SSB transmitter is also available.

2. Embodiment 2

Figure 4:
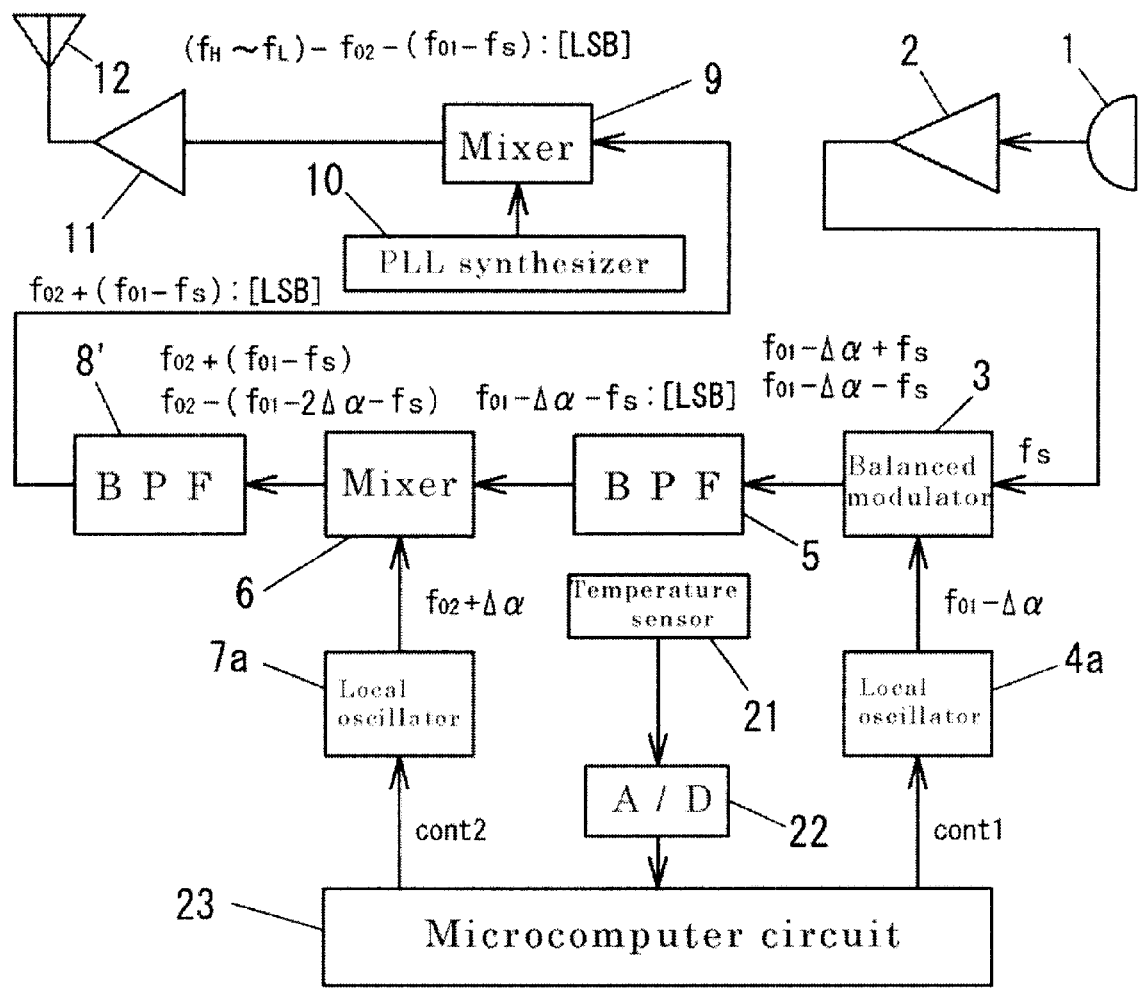
FIG. 4 is a system circuit diagram of an SSB transmitter by embodiment 2.

A system circuit diagram of the SSB transmitter of this embodiment is shown in FIG. 4.

As it is clear by comparing FIG. 1 and FIG. 4, the basic system composition is the same as in the embodiment 1, including the provision of the temperature sensor 21, the A/D converter 22 and the microcomputer circuit 23', and the circuit elements bearing the same symbols in these figures correspond to each other.

This embodiment features that the BPF 8' extracts out of a sum component signal and a difference component signal obtained by the mixer 6 the sum component signal, and that the control program of the microcomputer circuit 23' is designed to control frequencies to local oscillators 4a and 7a in the opposite direction, and this embodiment differs from the embodiment 1 on these points.

Accordingly, like the case of the embodiment 1, based on the temperature of the BPF 8' detected by the temperature sensor 21, the microcomputer circuit 23' executes the control to change the frequency of an output signal of the local oscillator 4a from the frequency $f_{01}$ of carrier wave to be a standard, using a compensation table built in the microcomputer circuit 23', to enable the extraction of an LSB signal and the suppression of a carrier signal under the normal condition.

Figure 5:
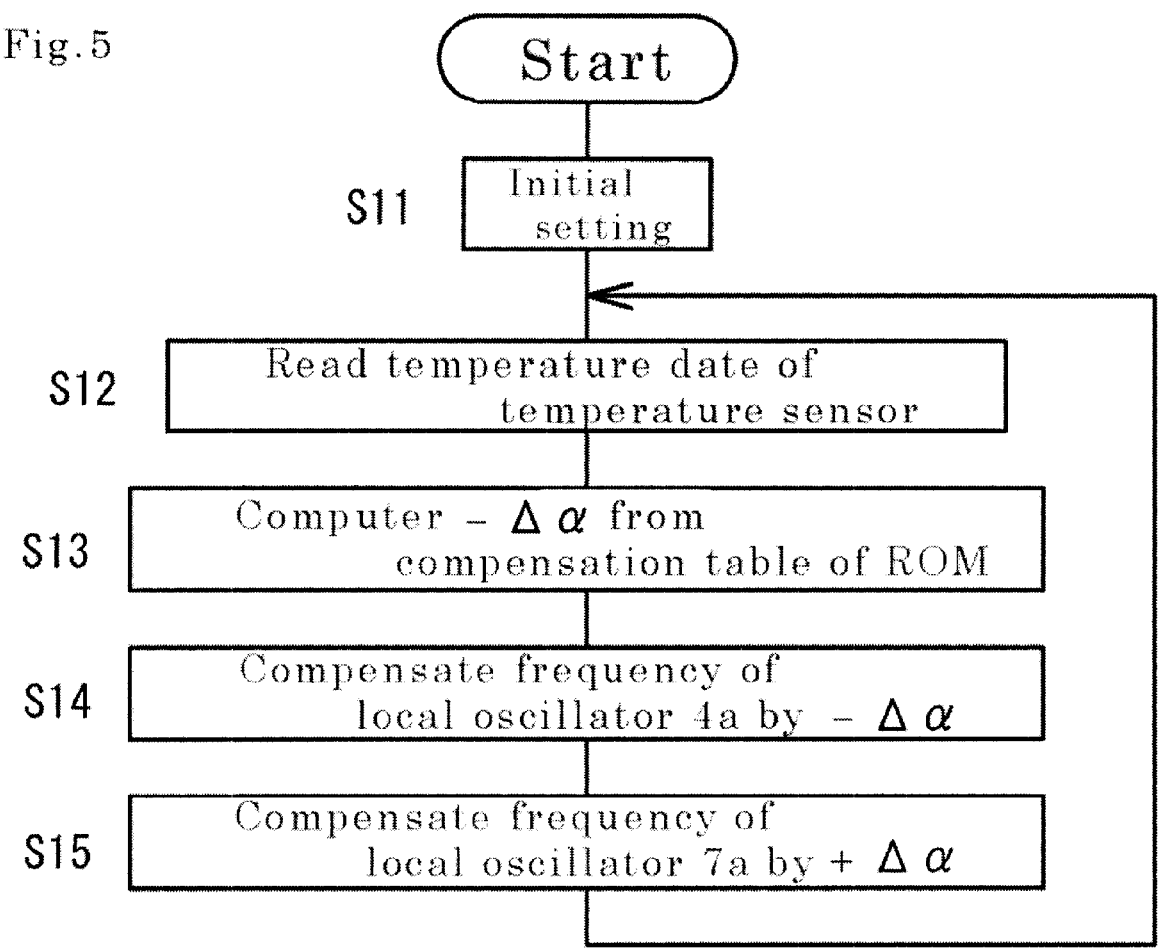
FIG. 5 is a flowchart showing the sequence of control operations to cope with temperature changes of the BPF.

That is, the operation procedure related to temperature compensation in the SSB transmitter of this embodiment is shown by the flowchart of FIG. 5, and executing operations from steps S11 through S14 are the same as in FIG. 3.

While the mixer 6 is to mix the LSB signal ($f_{o1}-\Delta\alpha+fs$) extracted by the BPF 5 with the output signal of the local oscillator 7a, as described above, the BPF 8' extracts the sum component signal in this embodiment.

In this case, like the case of the embodiment 1, the microcomputer circuit 23' changes the frequency of output signal of the local oscillator 7a by the same frequency component ($-\Delta\alpha$) as on the local oscillator 5a side, so that the sum component signal obtained from the mixer 6 is [$f_{o2}+(f_{o1}+2\Delta\alpha-fs)$] which deviates from the prescribed radio frequency signal by $2\Delta\alpha$.

That is, as the control in embodiment 1 is presupposed to extract a difference component signal by the BPF 8, the same control condition cannot be applied to the SSB transmitter of this embodiment.

Whereas, in this embodiment, responding to the BPF 8' extracting a sum component signal, the microcomputer circuit 23' changes the frequency of output signal of the local oscillator 7a by $\Delta\alpha$ in the opposite direction from the local oscillator 5a side to make it ($f_{o2}+\Delta\alpha$) (S15).

As a result, the sum component signal obtained from the mixer 6 becomes [$f_{o2}-(f_{o1}-fs)$] and the difference component signal becomes [$f_{o2}+(f_{o1}+2\Delta\alpha-fs)$], however, since the BPF 8' extracts the sum component signal [$f_{o2}+(f_{o1}-fs)$], the normal radio frequency signal can be obtained.

The SSB transmitter of this invention has the above composition and presents the following effects:

In the SSB transmitter that amplitude-modulates the carrier frequency signal by the first oscillation means by an input signal; extracts one sideband signal from the modulated signal by the first filter; mixes the sideband signal with a local oscillation frequency signal of the second oscillation means; and extracts the difference component signal or the sum component signal out of signals obtained by said mixing by the second filter to obtain a radio frequency signal with a prescribed frequency, a problem such that, due to a temperature change of the first filter and inability to maintain the suppression ratio of carrier wave below a prescribed value, the central frequency of the passband changes as well as a sound signal deteriorates can be met by accommodation-controlling the frequency of the output signal of the first and second oscillation means by detecting the temperature of the first filter so as for the radio frequency signal with the prescribed frequency to be obtained while always maintaining the passband of the first filter for both sideband signals amplitude-modulated by the first oscillation means under an optimal condition, and thus the transmission of high-quality sound signals, while maintaining the suppression ratio below the prescribed value, is enabled.

What is claimed is:

1. An SSB transmitter for amplitude-modulating a carrier frequency signal by first oscillation means by an input signal, extracting one of sideband signals from the modulated signal by a first filter, mixing the sideband signal with a local oscillation frequency signal of second oscillation means, and extracting out of a sum component signal and a difference component signal obtained by said mixing the difference component signal by a second filter so as to obtain a radio frequency signal with a prescribed frequency, comprising:

temperature detection means for detecting a temperature of said first filter; memory means for storing changes in central frequency of a passband due to temperature changes from a reference temperature at said first filter; and control means for changing the frequency of output signals of said first and second oscillation means by $\Delta f$ when a change in central frequency of the passband of said first filter obtained by said memory means is $\Delta f$ based on a temperature information detected by said temperature detection means, while setting a reference frequency of output signals of said first and second oscillation means for a frequency with which a radio frequency signal with said prescribed frequency can be obtained in the passband of said first filter at said reference temperature.

2. An SSB transmitter for amplitude-modulating a carrier frequency signal by first oscillation means by an input signal, extracting one of sideband signals from the modulated signal by a first filter, mixing the sideband signal with a local oscillation frequency signal of second oscillation means, and extracting out of a sum component signal and a difference component signal obtained by said mixing the sum component signal by a second filter so as to obtain a radio frequency signal with a prescribed frequency, comprising:

temperature detection means for detecting a temperature of said first filter; memory means for storing changes in central frequency of a passband due to temperature changes from a reference temperature at said first filter; and control means for changing the frequency of an output signal of said first oscillation means by $\Delta f$ and the frequency of an output signal of said second oscillation means by $-\Delta\alpha$ when a change in central frequency of the passband of said first filter obtained by said memory means is $\Delta f$ based on a temperature information detected by said temperature detection means, while setting a reference frequency of output signals of said first and second oscillation means for a it frequency with which a radio frequency signal with said prescribed frequency can be obtained in the passband of said first filter at said reference temperature.

* * * * *